United States Patent [19]

Yokoyama

[11] Patent Number: 4,801,823
[45] Date of Patent: Jan. 31, 1989

[54] SAMPLE HOLD CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 92,235

[22] Filed: Sep. 2, 1987

[30] Foreign Application Priority Data

Sep. 10, 1986 [JP] Japan .................................. 61-213383

[51] Int. Cl.⁴ ............................................. G11C 27/02
[52] U.S. Cl. ..................................... 307/353; 328/151
[58] Field of Search ................... 307/353, 352; 328/151

[56] References Cited

U.S. PATENT DOCUMENTS 3,643,110 2/1972 Thompson ........................... 307/353
3,702,942 11/1972 Aguirre ................................ 307/352
4,636,659 1/1987 Sugimoto ............................. 307/353

OTHER PUBLICATIONS

R. A. DePerna, "Signal is Sampled and held for 1 Minute" Electronics, May 1, 1967, pp. 71-72.

*Primary Examiner*—John Zazworsky
*Attorney, Agent, or Firm*—Spensley Horn Jubas & Lubitz

[57] ABSTRACT

A sample hold circuit consists of a variable gain voltage-to-current converter and an integration circuit which are connected in series. The conversion gain of the variable gain voltage-to-current converter varies in response to a level of a sampling pulse and one of a follow mode and a hold mode is selected in response to the level of the sampling pulse. In the follow mode when the level of the sampling pulse is high, the conversion gain of the converter is set to the maximum and an output signal of the integration circuit follows up an analog input signal which is inputted into the converter. In the hold mode when the level of the sampling pulse is low, the conversion gain of the converter is set to the minimum and the level of the output signal of the integration circuit is held at a level just before the hold mode is selected.

7 Claims, 4 Drawing Sheets

4,801,823

SAMPLE HOLD CIRCUIT

BACKGROUND OF THE INVENTION

1. Field of the Invention

The present invention generally relates to sample hold circuits, and more particular to a sample hold circuit which can reduce a distortion rate of an output waveform thereof.

2. Prior Art

FIG. 1 is a circuit diagram showing an example of a conventional non-inversion type sample hold circuit. In FIG. 1, 1 designates an input terminal supplied with an audio input signal, for example, 2 designates an operational amplifier, 3 designates a switch which is turned on or off by a sampling pulse, 4 designates a capacitor, 5 designates a buffer amplifier having a high input impedance and a gain of one (+1), and 6 designates an output terminal. When the switch 3 is turned on, the capacitor 4 is charged up to the state where the charged level thereof becomes equal to an input signal level. On the other hand, when the switch 3 is turned off, the charged voltage of the capacitor 4 is outputted as a sample voltage via the buffer amplifier 5 and the output terminal 6 in series.

FIG. 2 is a circuit diagram showing an example of a conventional inversion type sample hold circuit. In FIG. 2, 8 designates as input terminal, 9 and 10 designate resistors having the same resistance R, 11 and 12 designate switches which are turned on and off in synchronism with the sampling pulse, 13 designates an integration circuit which is constituted by an amplifier 14 and a capacitor 15, and 16 designates an output terminal. When an input signal $S_i$ such as an audio signal is supplied to the input terminal 8 and the switch 11 is turned off and the switch 12 is turned on, the output signal $S_o$ at the output terminal 16 (which is identical to the output signal of the operational amplifier 14) becomes identical to an inverted input signal. In addition, the capacitor 15 is charged up to the state where the charged level of the capacitor 15 equals the output signal level. Next, when the switch 11 is turned on and the switch 12 is turned off, the charged voltage of the capcitor 15 is continously outputted via the output terminal 16, regardless of the input signal variation. FIG. 3(a) shows waveforms of the input signal $S_i$ (shown by a dotted line) and the output signal $S_o$ (shown by a continuous line), and FIG. 3(b) shows an ON/OFF state of the switch 12. In FIG. 3(b), F designates a follow mode period when the output signal $S_o$ follows up the input signal $S_i$, and H designates a hold mode period when the voltage held in the capacitor 15 is outputted as the output signal $S_o$.

Meanwhile, the complementary MOS (CMOS) analog switches which have no current offset as shown in FIG. 4 are used for the switches 3, 11 and 12 in the conventional sample hold circuit shown in FIGS. 1 and 2. However, such analog switches have the following problems (1) to (3).

(1) A relatively high level (e.g., approximately ±5 V) is required as an amplitude of a sampling pulse $S_p$ (shown in FIG. 5) for the analog switch.

(2) The withstand voltage of the analog switch is relatively low, hence, it is possible to only use a relatively low level signal (e.g., approximately ±10 V) as the input signal $S_i$.

(3) Since the analog switch has an equivalent capacitance $E_c$ as shown by a dotted line in FIG. 4, the switch portion is shorted at the leading edge and trailing edge portions of the sampling pulse $S_p$ due to the relatively larger (dV/dt) of the leadings and traillings, whereby spikes appear in the output signal $S_o$ as shown in FIG. 5. The spikes of the output signal $S_o$ causes noises. Further, the spikes vary the held charge voltage of the capacitor 15, so that the distortion corresponding to the spikes will be generated.

As described heretofore, the CMOS analog switch has various problems.

On the other hand, the analog switch using a bipolar transistor 18 as shown in FIG. 6 is well known. In such as analog switch, the allowable input voltage depends on a withstand voltage between emitter and collector of the transistor 18. Hence, it is possible to input the relatively high voltage, however, since analog switch has the following problems (1) and (2).

(1) When the switch 19 is turned off, the transistor 18 (the analog switch) is turned on. In this case, the base current of the transistor 18 is varied in response to a voltage at an input terminal IN, and the variation of the base current causes the transistor 18 to generate the distortion in the collector voltage of the transistor 18.

(2) In order to turn the transistor 18 on, a certain voltage between emitter and base of the transistor 18 is required. Hence, the input voltage of the sample hold circuit must be lower than a power source voltage thereof and an utilization efficiency of a power source must be deteriorated.

SUMMARY OF THE INVENTION

It is accordingly a primary object of the present invention to provide a small hold circuit in which the distortion and the noise included in the output signal can be reduced.

It is another object of the present invention to provide a sample hold circuit in which the follow mode and hold mode can be selectively changed by a relatively low level sampling pulse.

In one aspect of the invention, there is provided a sample hold circuit comprising: (a) mode selecting means for selecting one of a hold mode and a follow mode in response to the sampling pulse, the analog input signal being inputted via an input terminal and sampled at a first timing in response to the sampling pulse, the sampled level of the analog input signal being outputted therefrom in the hold mode, an output signal which follows up the analog input signal being outputted therefrom at a second timing in response to the sampling pulse in the follow mode; and (b) an integration circuit means for holding and outputting the output signal of the mode selecting means via an output terminal.

BRIEF DESCRIPTION OF THE DRAWINGS

Further objects and advantages of the present invention will be apparent from the following description, reference being had to the accompanying drawings wherein a preferred embodiment of the present invention is clearly shown.

In the drawings.

DESCRIPTION OF THE PREFERRED EMBODIMENT

Figure 7:
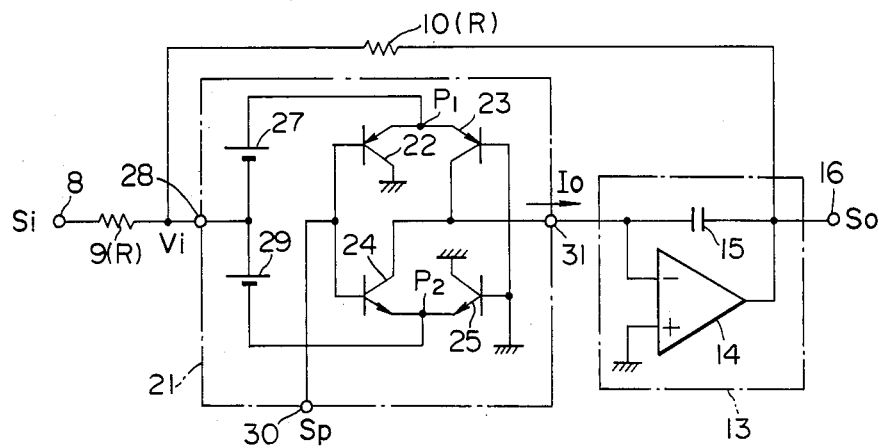
FIG. 7 is a circuit diagram showing an embodiment of a sample hold circuit according to the present invention.

Referring now to the drawings, wherein like reference characters designate like or corresponding parts throughout the several views and description thereof will be omitted. FIG. 7 is a circuit diagram showing an embodiment of the sample hold circuit according to the present invention.

Figure 1:
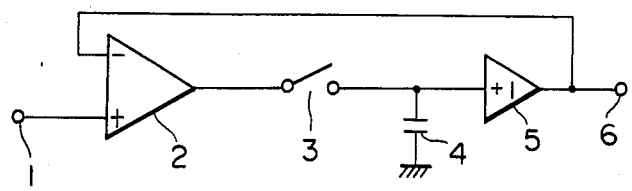
FIGS. 1 and 2 are circuit diagrams showing examples of the conventional sample hold circuits.
Figure 2:
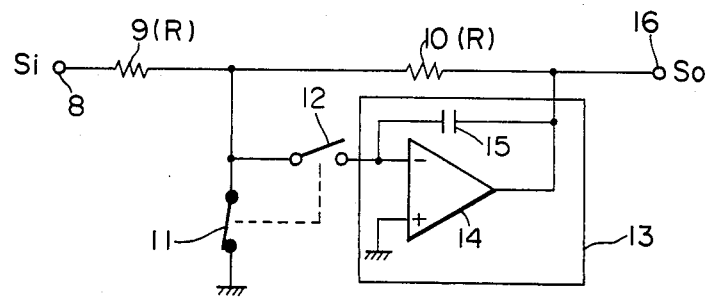
Figure 3:
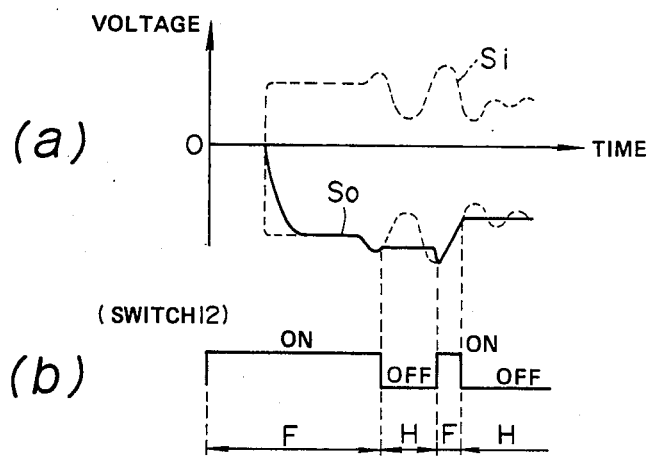
FIGS. 3 and 5 show waveforms of signals at several points within the conventional sample hold circuit shown in FIG. 2.
Figure 4:
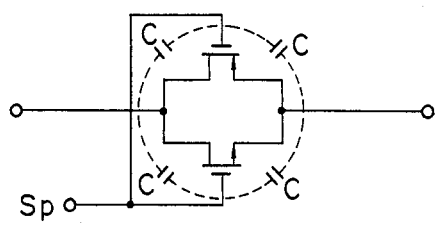
FIGS. 4 and 6 are circuit diagrams showing analog switches used in the conventional sample hold circuits.
Figure 5:
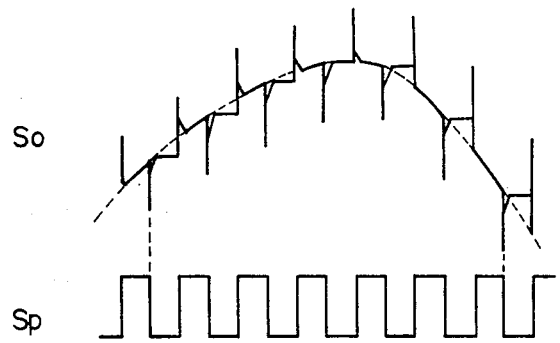
Figure 6:
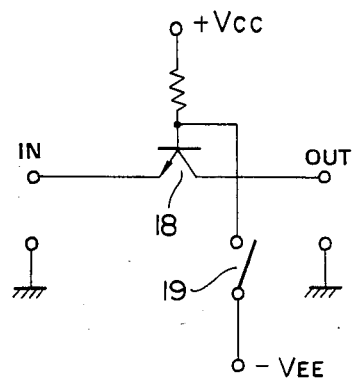

In FIG. 7, 21 designates a main part of the present invention, i.e., a variable gain voltage-to-current converter (hereinafter, referred to as a V/C converter) which selects one of the hold mode and the follow mode and which is provided instead of the switches 11 and 12 shown in FIG. 2. In the V/C converter 21, 22 and 23 designate first and second PNP transistors, the emitters of which are connected in common at a connection point $P_1$, and 24 and 25 designate first and second NPN transistors, the emitters of which are connected in common at a connection point $P_2$. The connection point $P_1$ is connected to a first terminal 28 via a first bias power source 27 (a first bias circuit), and the connection point $P_2$ is connected to the first terminal 28 via a second bias power source 29 (a second bias circuit). In addition, the bases of the transistors 22 and 24 are connected in common to a second terminal 30, and the collectors of the transistors 23 adn 24 are connected in common to a third terminal 31. Further, the collectors of the transistors 22 and 25 are grounded, and the bases of the transistors 23 and 25 are grounded. A voltage $V_i$ at a connection point between the resistors 9 and 10 are supplied to the first terminal 28, a voltage obtained at the third terminal 31 is supplied to an inverting input terminal of the operational amplifier 14, and the sampling pulse $S_p$ is supplied to the second terminal 30.

The V/C converter 21 having the above-mentioned constitution converts the voltage $V_i$ into a current $I_o$, and the current $I_o$ is outputted via the terminal 31. In addition, the V/C converter 21 varies the conversion gain in response to the voltage supplied at the terminal 30. More specifically, the above conversion gain becomes larger as the voltage level supplied at the terminal 30 becomes higher in positive, and the conversion gain becomes smaller as the voltage level at the terminal 30 becomes greater in negative.

Figure 8:
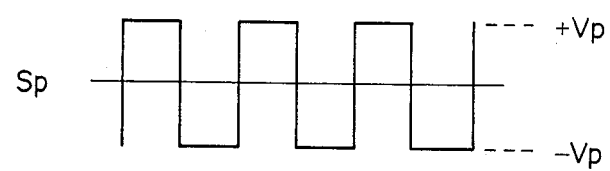
FIG. 8 shows a waveform of a sampling pulse supplied to the circuit shown in FIG. 7.

Next, FIG. 8 shows an example of the sampling pulse $S_p$ which is supplied to the terminal 30. As shown in FIG. 8, the sampling pulse $S_p$ has a high level voltage $+V_p$ and a low level voltage $-V_p$. This high level voltage $+V_p$ is set to a voltage slightly lower than a cut off voltage where the transistors 22 and 25 are cut off. Similarly, the low level voltage $-V_p$ is set to a voltage slightly higher than a cut off voltage where the transistors 23 and 24 are cut off. Hence, the transistors 22 to 25 are not cut off by the sampling pulse $S_p$. More specifically, the high level voltage $+V_p$ is set to a voltage where the transistors 22 to 25 are not saturated and the gain of the V/C converter 21 is maximum, and the low level voltage $-V_p$ is set to a voltage where the transistor 22 to 25 are not saturated and the gain of the V/C converter 21 is minimum. By supplying such sampling pulse $S_p$ to the terminal 30, the input signal $S_i$ is held when the level of the sampling pulse $S_p$ is equal to the low level $-V_p$, and the output signal $S_o$ follows up the input signal $S_i$ when the level of the sampling pulse $S_p$ is equal to the high level $+V_p$.

Next, description will be given with respect to the operation of the circuit shown in FIG. 7 in each cases where [A] $S_p=+V_p$, [B] $S_p=-V_p$ and [C] $-V_p<S_p<+V_p$.

[A] $S_p=+V_p$

In the case where the level of the sampling pulse $S_p$ equals to the high level $+V_p$, the collector currents of the transistors 22 and 25 becomes extremely small and the collector currents of the transistors 23 and 24 becomes large, so that the conversion gain of the V/C converter 21 is maximum. In this state, the voltage $V_i$ at the terminal 28 varies in the positive direction when the level of the input signal $S_i$ varies in the positive direction, whereby the commong collector potential of the transistors 23 and 24 will be raised. As described before, the common collector of the transistors 23 and 24 is connected to the inverting input terminal of the operational amplifier 14 and the non-inverting input terminal of the operational amplifier 14 is grounded. Hence, the common collector of the transistors 23 and 24 can be described identical to a virtual ground point. As a result, the output level of the operational amplifier 14 will be lowered when the common collector potential of the transistors 23 and 24 rises. Thus, the circuit will be in a stable state in that the voltage $V_i$ reaches to 0 V. In addition, when the voltage $V_i$ is at 0 V, the collector potential of the transistors 23 and 24 is also at 0 V. Since the resistors 9 and 10 have the same resistance, it is apparent that the output signal $S_o$ (i.e., the output signal of the operational amplifier 14) becomes identical to the inverted input signal, i.e., $S_o=-i$.

As described heretofore, when the input signal $S_i$ varies in the positive direction, the output signal $S_o$ varies by the same voltage variation of the input signal $S_i$ in the negative direction. At this time, the capacitor 15 is charged by the current $I_o$ which is outputted from the common collector of the transistors 23 and 24. In this case, the conversion gain of the V/C converter 21 is maximum and the current $I_o$ is sufficiently large, hence, the delay time between the output signal $S_o$ and the input signal $S_i$ is extremely small.

On the contrary, the varying operation of the output signal $S_o$ is similar to that of the above-mentioned case even when the input signal $S_i$ varies in the negative direction. In other words, the circuit shown in FIG. 7 will be the follow mode where the output signal $S_o$ follows up the input signal $S_i$ when the level of the sampling pulse $S_p$ equals to the high level $+V_p$.

[B] $S_p=-V_p$

In the case where the level of the sampling pulse $S_p$ equals to the low level $-V_p$, the collector currents of the transistors 23 and 24 becomes small and the collector currents of the transistors 22 and 25 becomes larger, so that the conversion gain of the V/C converter 21 is minimum (approximately zero). As a result, the voltage $V_i$ follows up the input signal $S_i$, the level of which varies from zero level. However, the common collector potential of the transistors 23 and 24 does not vary, regardless of the variation of the voltage $V_i$. Therefore, the output level of the operational amplifier 14 does not vary (i.e., the output level of the operational amplifier '14 is fixed at the charge level of the capacitor 15). At this time, the level of the current $I_o$ is approximately zero, hence, the charge voltage of the capacitor 15 will not be discharged. In other words, the circuit shown in FIG. 7 will be the hold mode where the output signal $S_o$ is held at the charge voltage of the capacitor 15 in the case where the level of the sampling pulse $S_p$ equals to the lower level $-V_p$.

[C] $-V_p < S_p < +V_p$

In the case where the level of the sampling pulse $S_p$ varies in a voltage range between the high level $+V_p$ and the low level $-V_p$, the conversion gain of the V/C converter 21 varies and the collector currents of the transistors 22 to 25 varies as well.

Figure 9:
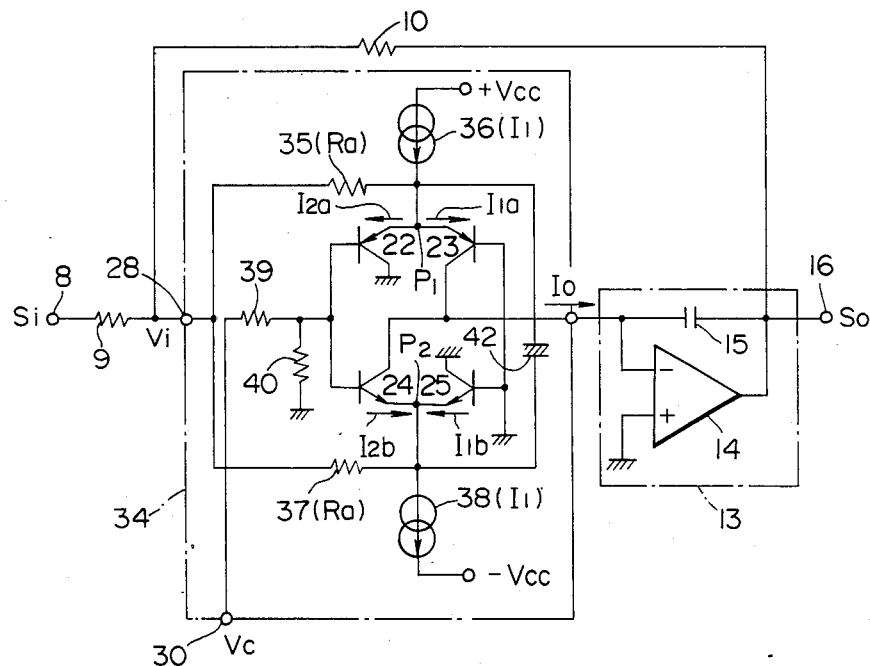
FIG. 9 is a circuit diagram showing a detailed constitution of the circuit shown in FIG. 7.

Next, FIG. 9 is a circuit diagram showing a detailed constitution of the circuit shown in FIG. 7. In FIG. 9, the corresponding parts within the circuit shown in FIG. 7 will be designated by the same numerals, and the description thereof will be omitted. The circuit shown in FIG. 9 differs from the circuit shown in FIG. 7 in the following three differences (i.e., first to third difference).

In the first difference, a resistor 35 (having a resistance Ra) and a constant current source 36 (having a current value $I_1$) are provided instead of the bias power source 27 shown in FIG. 7 and a resistor 37 (having the resistance Ra) and a constant current source 38 (having the current value $I_1$) are provided instead of the bias power source 29 shown in FIG. 7. In the second difference, a resistor 39 is inserted between the common base of the transistors 22 and 24 and the second terminal 30, and this common base is grounded via a resistor 40. In the third difference, a capacitor 42 is inserted between the common emitter (the connection point $P_1$) of the transistor 22 and 23 and the common emitter (the connection point $P_2$) of the transistors 24 and 25. This capacitor 42 is inserted in order to stabilize the voltage generated between the common emitter of the transistors 22 and 23 and the common emitter of the transistors 24 and 25.

In the above-mentioned constitution, the following formulae (1) and (2) can be obtained based on properties of PN junctions of the transistors 22 to 25 in the case where the voltage inputted at the terminal 30 denotes as $V_c$, the emitter currents of the transistors 22 and 23 respectively denotes as $I_{2a}$ and $I_{1a}$, the emitter currents of the transistors 24 and 25 rspectively denotes as $I_{2b}$ and $I_{1b}$, and a predetermined coefficient denotes as K.

$$V_c = -K \cdot \log(I_{2a}/I_{1a}) \quad (1)$$

$$V_c = K \cdot \log(I_{2b}/I_{1b}) \quad (2)$$

Where K = kT/q (where k designates the Boltzmann's constant, T designates the absolute temperature and q designates the charge quantity of electrons) In addition, the following formulae can be obtained when the voltage $V_b$ represents the voltages between emitters and bases of the transistors 22 to 25.

$$I_{1a} + I_{2a} = I_1 + (V_i - V_b)/Ra \quad (3)$$

$$I_{1b} + I_{2b} = I_1 - (V_i - V_b)/Ra \quad (4)$$

The above formulae (3) and (4) can be summarized into the following formulae (5) and (6) when voltages $V_i$ and $V_b$ are set as $V_i \gg V_b$.

$$I_{1a} + I_{2a} = I_1 + V_i/Ra \quad (5)$$

$$I_{1b} + I_{2b} = I_1 - V_i/Ra \quad (6)$$

Meanwhile, the current $I_o$ can be described as the following formula (7).

$$I_o = I_{1a} - I_{2b} \quad (7)$$

Therefore, the following formula (8) can be obtained from the above-mentioned formulae (1), (2), (5), (6) and (7).

$$I_o = 2V_i/Ra/[\exp(-V_c/K) + 1] \quad (8)$$

Based on the above formula (8), a conversion gain $g_m$ of a V/C converter 34 (which corresponds to the V/C converter 21 shown in FIG. 7) can be described as the following formula (9).

$$g_m = I_o/V_i = 2/Ra/[\exp(-V_c/K) + 1] \quad (9)$$

Figure 10:
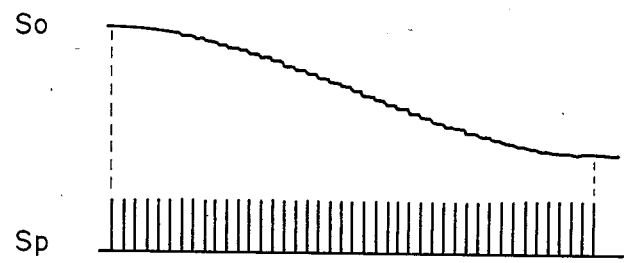
FIG. 10 shows waveforms of sampling pulse and output signal in the circuit shown in FIG. 9.
Figure 11:
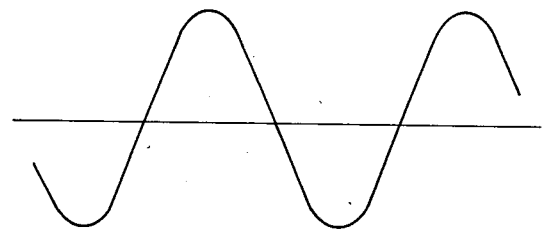
FIG. 11 shows a waveform of a signal which is obtained by passing the output signal shown in FIG. 10 through a low-pass filter.

As is apparent for the above formula (9), the conversion gain $g_m$ depends on the voltage $V_c$ supplied to the terminal 30. More specifically, the conversion gain $g_m$ becomes larger as the voltage $V_c$ becomes larger. Hence, in the case where the input signals $S_i$ is inputted into the input terminal 8 and the sampling pulse $S_p$ is supplied to the terminal 30, the signal $S_o$ which is obtained by sampling the input signal $S_i$ can be obtained at the output terminal 16. FIG. 10 shows an experimental result for the circuit shown in FIG. 9. More specifically, FIG. 10 shows the waveform of the output signal $S_o$ at the output terminal 16 in the case where a sine wave signal having a frequency of 1 kHz is inputted into the input terminal 8 and the sampling pulse $S_p$ having a sampling frequency of 88 kHz is supplied to the terminal 30. In addition, FIG. 11 shows a waveform of a signal which is obtained by passing the sampled output signal $S_o$ (shown in FIG. 10) through the low-pass filter (not shown).

As described heretofore, the advantages of the present invention can be summarized into the following four points (i) to (iv).

(i) Conventionally, a selecting control for the hold and follow modes is performed by use of a switching circuit. However, the present invention performs the above selecting control based on an analog operation by use of the variable gain voltage-to-current converter which works as an analog multiplier. As a result, it is possible to eliminate the noise and the distortion based on the switching operations of the above switching circuit.

(ii) It is possible to sufficiently perform the selecting control for the hold and follow modes by use of the sampling pulse having relatively low level because the variable gain voltage-to-current converter has an amplifier gain and the gains of the transistors thereof vary in response to the level of the sampling pulse.

(iii) Each transistor works as a base-grounded transistor, hence, it is possible to obtain the superior frequency characteristics. In other words, frequency band of the sample hold circuit is relatively wide and the distortion thereof is relatively small.

(iv) It is possible to apply the input signal having the sufficiently high level because the maximum level of the input signal is determined depending on the withstand voltage between emitter and collector of the transistor used in the V/C converter.

Above is the description of an embodiment of the present invention. This invention may be practiced or embodied in still other ways without departing from the spirit or essential character thereof. For instance, the input signal of the sample hold circuit is not limited to the audio signal, and any analog signal can be applied as the input signal. Therefore, the preferred embodiment described herein is illustrative and not restrictive, the scope of the invention being indicated by the appended claims and all variations which come within the meaning of the claims are intended to be embraced therein.

What is claimed is:

1. A sample hold circuit for sampling an analog input signal by use of a sampling pulse having a predetermined sampling frequency and holding and outputting the sampled level of said analog input signal for a predetermined period, said sample hold circuit comprising:
    (a) mode selecting means for selecting one of a hold mode and a follow mode in response to said sampling pulse, said analog input signal being inputted via an input terminal and sampled in response to said sampling pulse, an output signal which follows said analog input signal being outputted therefrom in response to selection of said follow mode by said sampling pulse, wherein the mode selecting means includes a variable gain voltage-to-current converting means which converts an input voltage of said analog input signal into a current corresponding to the level of the input voltage and outputs the converted current as said output signal, the conversion gain of the converting means being determined in accordance with the level of the sampling pulse; and
    (b) an integration circuit means for holding and outputting the output signal of said mode selecting means via an output signal terminal, sampled level of said analog input signal being outputted from the integration circuit means in response to selection of said hold mode by said sampling pulse.

2. A sample hold circuit according to claim 1, wherein the hold mode is selected at a first timing and the follow mode is selected at a second timing, wherein said first timing is a period when the level of said sampling pulse is low and said second timing is a period when the level of said sampling pulse is high.

3. A sample hold circuit according to claim 1, wherein said mode selecting means comprises first to third terminals, first to fourth transistors and first and second bias circuits, emitters of said first and second transistors being connected in common and emitters of said third and fourth transistors being connected in common, said first bias circuit being inserted between the connected emitters of said first and second transistors and said first terminal which is supplied with said analog input signal, said second bias circuit being inserted between the connected emitters of said third and fourth transistors and said first terminal, bases of said first and third transistors being connected in common to said second terminal which is supplied with said sampling pulse, the respective collectors of said first and fourth transistors being grounded and the respective bases of said second and fourth transistors being grounded, the collectors of said second and third transistors being connected in common to said third terminal which is connected to the input terminal of said integration circuit means.

4. A sample hold circuit according to claim 1, wherein said integration circuit means is constituted by an operational amplifier and a capacitor, an inverting input terminal of said operational amplifier being supplied with the output signal of said mode selecting means and a non-inverting terminal of said operational amplifier being grounded, said capacitor being connected between said inverting input terminal and an output terminal of said operation amplifier, the output terminal of which is connected to said output terminal.

5. A sample hold circuit according to claim 3, wherein said first and second transistors are constituted by PNP transistors and said third and fourth transistors are constituted by NPN transistors.

6. A sample hold circuit according to claim 5, wherein said first bias circuit is constituted by a first constant current source and a first resistor and said second bias circuit is constituted by a second constant current source and a second resistor, said first and second resistors having the same resistance, the connected emitters of said first and second transistors being connected to said first terminal via said first resistor and also being connected to one terminal of said first constant current source, the another terminal of which is supplied with a positive voltage, the connected emitters of said third and fourth transistors being connected to said first terminal via said second resistor and also being connected to one terminal of said second constant current source, the another terminal of which is supplied with a negative voltage.

7. A sample hold circuit according to claim 5, wherein said sampling pulse is a periodic signal having a high level set to a level where said first and fourth transistors are not saturated and the conversion gain of said variable gain voltage-to-current converting means is maximum, and a low level set to a level where said second and third transistors are not saturated and the conversion gain of said variable gain voltage-to-current converting means is minimum.

* * * * *